United States Patent [19]

Broadbent

[11] Patent Number: 4,517,225
[45] Date of Patent: May 14, 1985

[54] METHOD FOR MANUFACTURING AN ELECTRICAL INTERCONNECTION BY SELECTIVE TUNGSTEN DEPOSITION

[75] Inventor: Eliot K. Broadbent, San Jose, Calif.

[73] Assignee: Signetics Corporation, Sunnyvale, Calif.

[21] Appl. No.: 490,381

[22] Filed: May 2, 1983

[51] Int. Cl.³ .................... H01L 21/285; H01L 21/88
[52] U.S. Cl. .................................. 427/89; 156/659.1; 156/662; 156/664; 156/665; 156/666; 427/85; 427/90; 427/91; 427/96; 427/99; 430/318
[58] Field of Search .................... 427/89–91, 427/85, 96, 99; 430/318; 156/659.1, 662, 664, 665

[56] References Cited

U.S. PATENT DOCUMENTS 4,267,012  5/1981  Pierce ................................. 156/643
4,404,235  9/1983  Tarng ................................. 427/91

FOREIGN PATENT DOCUMENTS 52-149990 12/1977  Japan .
55-12766   1/1980  Japan .
55-85042   6/1980  Japan .
57-50429   3/1982  Japan .
1330720    9/1973  United Kingdom .

OTHER PUBLICATIONS

Shaw, "Vapor Deposited Tungsten for Silicon Devices", Solid State Technology, Dec. 1, 1971, pp. 53–57.
Miller, "Hot-Wall CVD Tungsten for VSLI", Solid State Technology, Dec. 1, 1980, pp. 79–82.

Primary Examiner—John D. Smith
Attorney, Agent, or Firm—R. J. Meetin; R. T. Mayer; T. A. Briody

[57] ABSTRACT

A structure for an electrical interconnection suitable for a semiconductor integrated circuit is made by a process utilizing selective tungsten deposition at low pressure to form an intermediate conductive layer without significantly ablating nearby insulating material.

24 Claims, 15 Drawing Figures

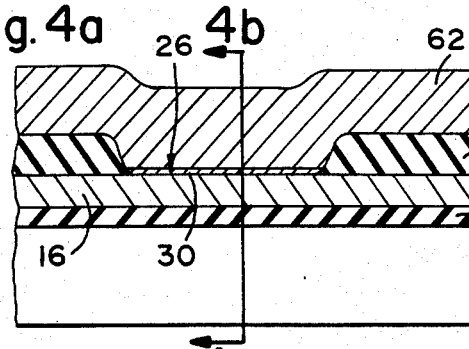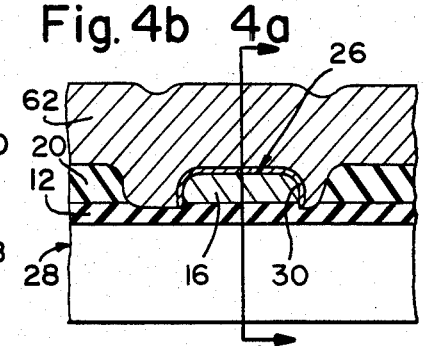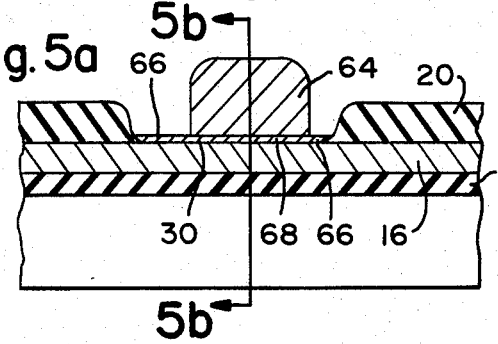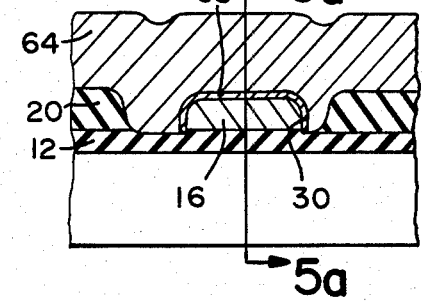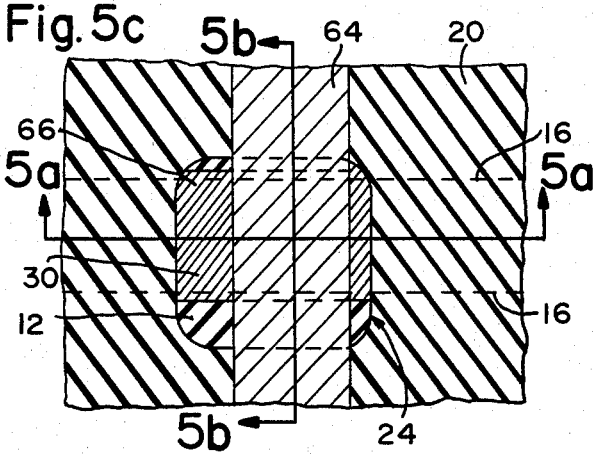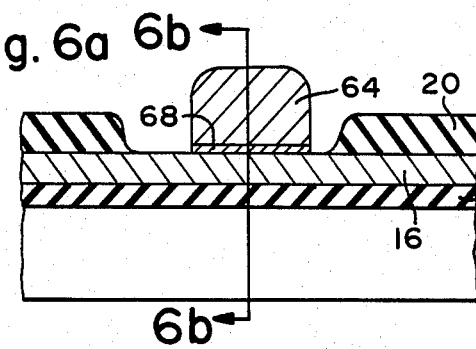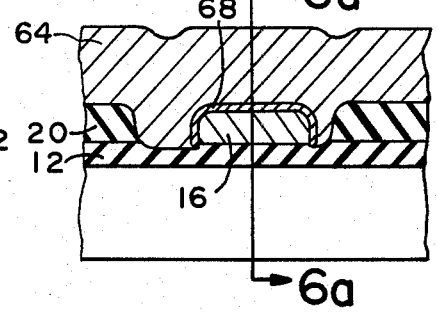

METHOD FOR MANUFACTURING AN ELECTRICAL INTERCONNECTION BY SELECTIVE TUNGSTEN DEPOSITION

FIELD OF USE

This invention relates to methods for fabricating electrical interconnection structures. This invention also relates to the resulting structures which are suitable for semiconductor integrated circuits.

BACKGROUND ART

Tungsten is employed for various purposes in manufacturing semiconductor integrated circuits. H. Kondo et al, Japanese patent publication Kokai No. 52-149990, "Method of Manufacturing Multilayer Wiring", discloses an electrical interconnection structure in which a thin film of a conductor such as tungsten is employed as an etch barrier for patterning aluminum and thereafter serves (in part) as an intermediate interconnection element. In making this structure, a first patterned conductive layer of aluminum is defined over a first insulating layer of silicon dioxide along a surface of a silicon semiconductor substrate. A second insulating layer typically consisting of silicon dioxide is formed over the first aluminum layer and over the exposed adjacent material of the first insulating layer. An aperture, commonly referred to as a "via", is then created through the second insulating layer to expose a surface portion of the first Al layer.

The thin tungsten film is deposited on the entire exposed upper surface of the structure—i.e., on the Al surface portion and on the remainder of the second insulating layer. A second aluminum layer is deposited on the tungsten film and then patterned with an etchant that does not significantly attack tungsten. As a result, the W film acts as an etch stop to prevent any portion of the first Al layer from being etched away. The exposed portions of the W film are now removed with an etchant that does not significantly attack aluminum. In the final structure, the remainder of the W film underlies all of the second patterned Al layer. The tungsten lying between the Al layers then serves as an intermediate connection in the structure.

A disadvantage of Kondo et al is that the tungsten lying between insulating material and the second patterned Al layer can cause single-crystal Al whiskers to emerge from it during operation. This leads to electrical shorts between initially insulated conductive lines, resulting in device failure. In addition, the tungsten on the insulating material increases the height (i.e., thickness) of the composite W/Al layer. The increased height produces a more formidable step profile to cover when one or more further layers are deposited on the structure.

Tungsten is conventionally deposited as a relatively uniform film on a composite surface consisting of different materials as shown, for example, in Kondo et al. However, tungsten can also be selectively deposited on such a composite surface under certain conditions as disclosed in J. J. Cuomo et al, British Pat. No. 1,330,720. In Cuomo et al, a patterned nucleating layer consisting, for example, of aluminum is first formed on a glass substrate. A tungsten layer is then formed on the patterned nucleating layer by chemical vapor deposition (CVD) at or near atmospheric pressure. The tungsten is provided by hydrogen reduction of tungsten hexafluoride in the immediate vicinity of the nucleating layer which serves as a surface for the tungsten to accumulate. The surface portions of the substrate laterally adjacent to the nucleating layer are simultaneously ablated (i.e., removed) during the tungsten CVD. As a result, tungsten only accumulates on the nucleating layer which prevents the underlying substrate portion from being ablated away. Typically, the thickness of the substrate portions ablated away is about the same as the thickness of the deposited W layer.

The selective tungsten deposition capability of Cuomo et al is a significant enhancement because selective deposition is simpler than uniform deposition followed by selective etching. However, the substantial substrate ablation in Cuomo et al is undesirable in many semiconductor applications, particularly in fabricating electrical interconnections of the type in Kondo et al as various structures having multiple thin layers whose thicknesses must be preserved.

DISCLOSURE OF THE INVENTION

In accordance with the invention, a structure for an electrical interconnection of an electrical device is manufactured by a process involving selective tungsten deposition. The structure is particularly suitable for an integrated circuit.

More particularly, a first patterned conductive layer is defined over a first insulating layer. The first conductive layer is typically aluminum alone or in combination with no more than 4% copper and/or no more than 4% silicon. The first conductive layer may, however, consist of other conductors such as tungsten, titanium, titanium-tungsten, molybdenum, gold, certain metal silicides, or doped polycrystalline silicon. A second insulating layer is formed over the first conductive layer and over adjacent material of the first insulating layer not underlying the first conductive layer. An aperture is then created through the second insulating layer to expose a surface portion of the first conductive layer. The aperture is normally formed oversize so as to expose some of the first insulating layer next to the exposed surface portion of the first conductive layer.

Tungsten is deposited on substantially all of this exposed surface portion to form an intermediate conductive layer. The tungsten deposition is performed in such a manner that virtually no tungsten simultaneously accrues on any nearby insulating material. However, if any tungsten does so accrue on nearby insulating material, the thickness of this tungsten is proportionally much less than the thickness of the intermediate conductive layer. If desired, any tungsten that accrued on nearby insulating material during the W deposition may be removed by a cleaning operation without significantly affecting the thickness of the intermediate conductive layer. In any case, any tungsten that exists on nearby insulating material is electrically inconsequential in the final structure.

The W deposition is preferably performed by low-pressure CVD in which the deposition pressure is no more than 5 torr. Tungsten is provided from a tungsten-containing species such as tungsten hexafluoride by hydrogen reduction in the immediate vicinity of the surface portion at a structure temperature in the range of 270° C. to 400° C. Under these conditions, no significant ablation of the insulating material occurs during the W deposition.

A further conductive layer is deposited on the intermediate conductive layer and on the adjacent portions of the structure. The further conductive layer is then suitably patterned to define a second patterned conductive layer having a part in contact with at least part of the intermediate conductive layer. This patterning is performed with etchant that does not significantly attack tungsten or the material of either insulating layer. Where the aperture is oversize, the etchant likewise does not attack material of the first insulating layer. Accordingly, the first conductive layer is not simultaneously etched to any significant degree. In short, the intermediate conductive layer of selectively deposited tungsten acts as an etch stop to protect the first conductive layer during patterning to create the second conductive layer.

The present invention largely avoids whisker growth from the second conductive layer since there is no significant W thickness on the insulating material below the second conductive layer. Electrical difficulties are drastically reduced compared to Kondo et al. The surface step profile in the present structure is likewise less steep so as to facilitate step coverage with any additional layer(s). This enables device density to be increased. Moreover, it is not necessary to remove tungsten not covered by the second conductive layer as Kondo et al must do. Since there is no significant ablation of the insulating material in the present invention, it thus provides the advantages of Kondo et al and Cuomo et al without their shortcomings.

BRIEF DESCRIPTION OF THE DRAWING

FIGS. 1a, 2a, 3a, 4a, 5a, and 6a are structural cross-sectional side views sequentially illustrating the manufacture of an electrical interconnection structure according to the invention. FIGS. 1a–6a are taken respectively through planes 1a—1a, 2a—2a, 3a—3a, 4a—4a, 5a—5a, and 6a—6a in FIGS. 1b, 3b, 4b, 5b, and 6b.

FIGS. 1b-6b, are cross-sectional side views of the structure taken perpendicularly to FIGS. 1a-6a respectively through planes 1b—1b, 2b—2b, 3b—3b, 4b-4b, 5b—5b, and 6b—6b.

FIG. 3c is a top view of the structure shown in FIGS. 3a and 3b, while FIG. 5c is a top view of the structure shown in FIGS. 5a and 5b. For convenience, FIGS. 3c and 5c are shaded according to the same convention used in FIGS. 1a—6a and 1b—6b even though FIGS. 3c and 5c are not cross-sectional views.

Like reference symbols are employed in the drawings and in the description of the preferred embodiments to represent the same or very similar item or items.

DESCRIPTION OF THE PREFERRED EMBODIMENTS

Figure 1A:
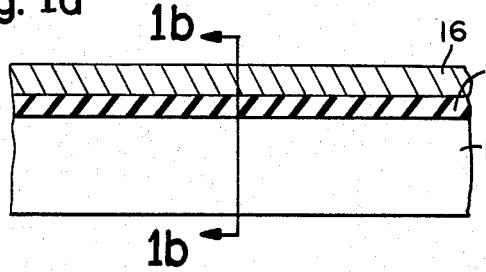

Referring to the drawings, FIGS. 1a-6a, 1b—6b, 3c, and 5c illustrate steps in fabricating an electrical interconnection structure according to a process involving selective tungsten deposition. In this process, all photoresist masks are formed according to conventional photolithographic techniques. The radio frequency (RF) level for all plasma etchings is 13.5 megahertz.

Figure 1B:
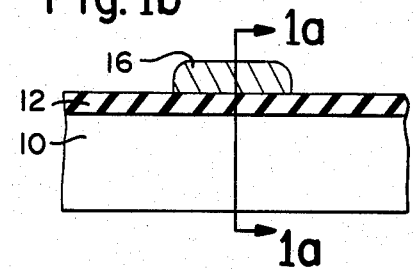

The starting material is a monocrystalline silicon semiconductor body 10 as indicated in FIGS. 1a and 1b. Body 10 may consist simply of a P-type or N-type doped substrate or of such a substrate with an epitaxial layer grown on it. Various N-type and P-type doped regions (not shown in the drawings) normally exist in body 10.

A first electrically insulating layer 12 of silicon dioxide lies along the upper surface of body 10. Insulating layer 12 is preferably grown according to conventional thermal oxidation techniques to a thickness of about 4,000 angstroms along the top of body 10. Layer 12 could also be formed by depositing $SiO_2$ on the top of body 10.

A first patterned electrically conductive layer 16 is defined on insulating layer 12 by sputter depositing a layer of aluminum with up to 4% copper by weight and/or up to 4% silicon by weight to a thickness of about 6,000 angstroms on the entire upper surface of layer 12, forming an appropriate photoresist mask (not shown) on top of the deposited layer, and then removing the undesired portions of the deposited layer with a suitable etchant that does not significantly attack layer 12. The etching is preferably performed at 100° C. for 5 minutes at a pressure of about 0.01 torr with a plasma consisting of equal parts by input volume of boron trichloride and chlorine in a system operating at 1,000 watts of RF power. Layer 16 is a conductive line having a width of about 4 microns and an orientation perpendicular to FIG. 1b. Optimally, layer 16 is Al with about 1% Cu.

After removing the photoresist mask, a second electrically insulating layer 20 is deposited on conductive layer 16 and on the exposed adjacent portions of insulating layer 12. Insulating layer 20 preferably consists of silicon nitride deposited according to conventional plasma deposition techniques to a thickness of about 7,000 angstroms.

Figure 2A:
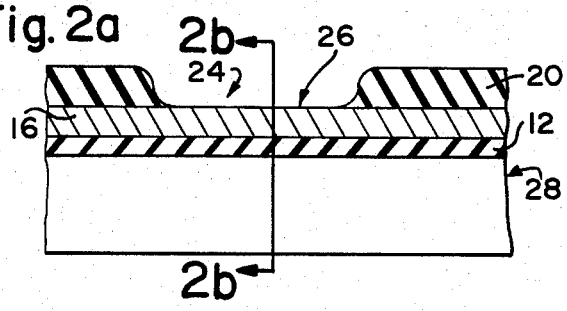
Figure 2B:
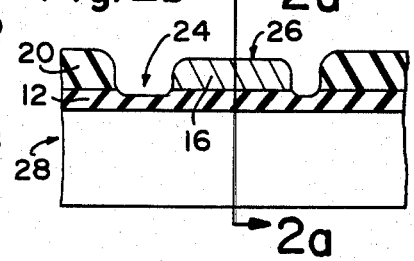

An aperture (or via) 24 about 7 microns by 7 microns in area is created through insulating layer 22 down to a surface portion 26 of conductive layer 16 to produce the structure indicated by symbol 28 in FIGS. 2a and 2b. In particular, an appropriate photoresist mask (not shown) is formed on the top of the structure after which layer 20 is etched through with a suitable etchant that does not significantly attack conductive layer 16. This etching is preferably done at 130° C. for 5 minutes at a pressure of about 0.7 torr with a plasma consisting of 4 parts by input volume of sulfur hexafluoride to 1 part of oxygen in a system operating at 200 watts of RF power.

As shown in FIG. 2b, aperture 24 is an oversize via in that it extends laterally beyond the side edges of conductive layer 16. This makes registration of the photoresist mask used in defining aperture 24 "non-critical" as indicated by the slight misalignment of line 16 relative to aperture 24 in FIG. 2b and the corresponding slight misalignment illustrated later in FIG. 5a. As further shown in FIG. 2b, aperture 24 also extends slightly into insulating layer 12. However, this is not necessary. In fact, aperture 24 need not extend all the way through layer 20 on the sides of layer 16. Nor is it necessary that the side edges of layer 16 be exposed. That is, aperture 24 need only expose part of the actual top of layer 16.

After removing the photoresist mask, resulting structure 28 is carefully precleaned to remove contaminants including organic matter, dust, and particulates. In this precleaning operation, structure 28 is first placed in a bath of 10 parts by weight of sulfuric acid to 1 part of hydrogen peroxide for 10 minutes at 100° C. after which structure 28 is rinsed in deionized water for 10 minutes and spun dry for 6 minutes. Structure 28 is then treated at 100° C. for 2 minutes at a pressure of about 0.5 torr in a plasma consisting of 9 parts by input volume of oxygen to 1 part of carbon tetrafluoride at 275 watts of RF power. Finally, structure 28 is placed in a bath of 100 parts by weight of water to 1 part of hydrofluoric acid for 30 seconds at room temperature after which structure 28 is rinsed in deionized water for 10 minutes and spun dry for 6 minutes.

Figure 3A:
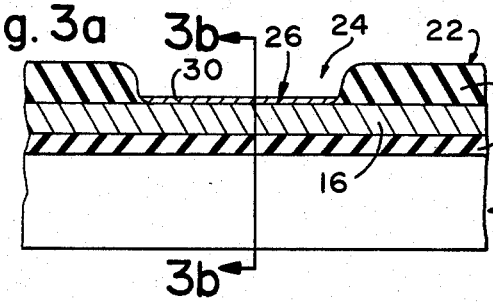
Figure 3B:
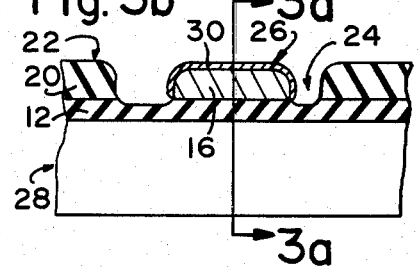
Figure 3C:
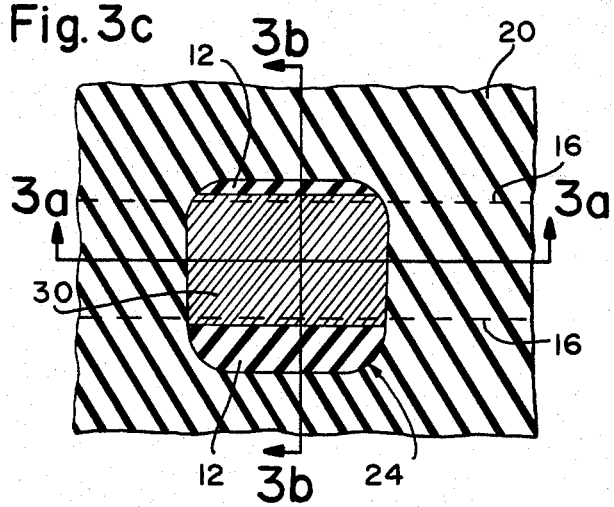

Next, tungsten is deposited on exposed surface portion 26 to form an intermediate electrically conductive layer 30 having a thickness of about 1,500 angstroms as shown in FIGS. 3a–3c. Tungsten layer 30 entirely surrounds surface portion 26 as indicated in FIG. 3b. The tungsten deposition is performed in such a manner that less than one monolayer (i.e., less than $10^{15}$ atoms/cm$^2$) of tungsten simultaneously accrues on the exposed portions of insulating layer 12 adjacent to surface portion 26 or on nearby exposed portions of insulating layer 20. This W thickness on layers 12 and 20 is so small as to be electrically inconsequential—i.e., it will not conduct sufficient (if any) electricity to effect the electrical characteristics of the final electrical interconnection structure.

Figure 7:
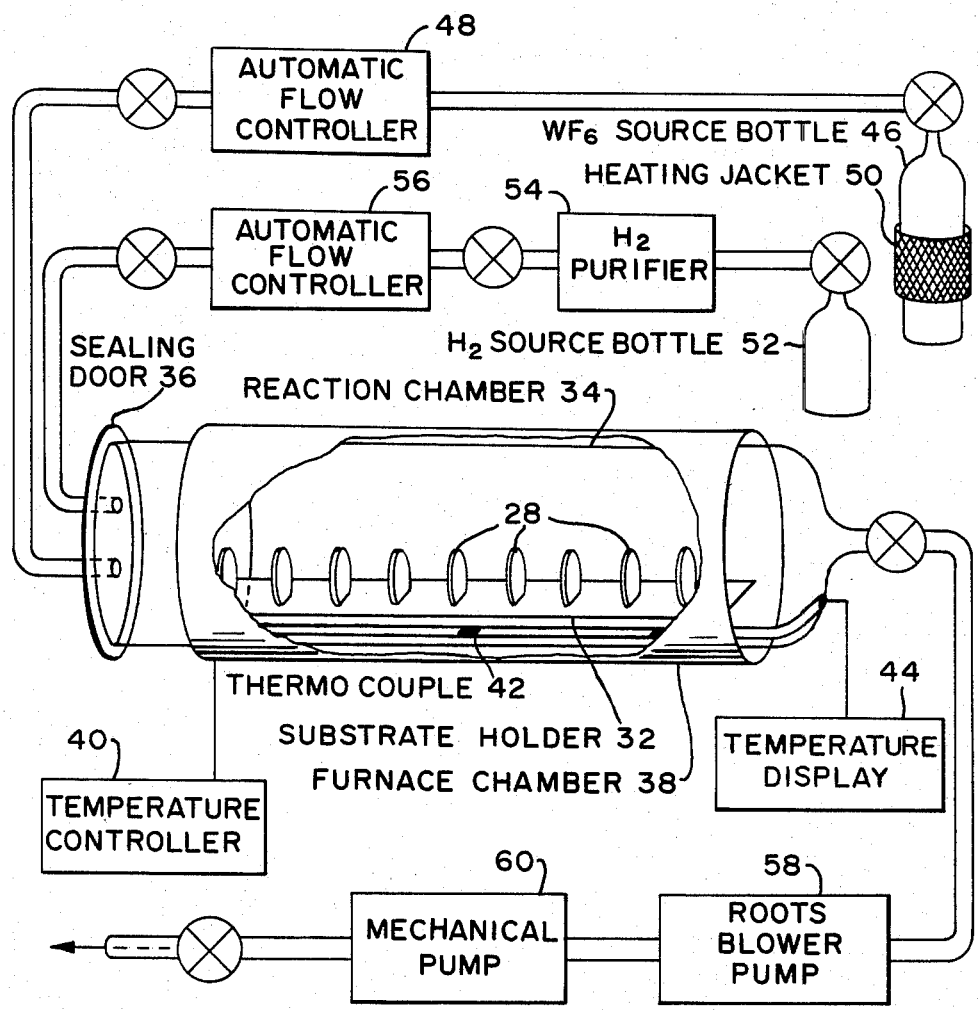
FIG. 7 is a schematic/block diagram of a CVD apparatus suitable for use in manufacturing the electrical interconnection structure of the previous figures.

More particularly, W layer 30 is created by low pressure CVD in which tungsten is provided from gaseous tungsten hexafluoride by reducing it in a hydrogen environment near surface portion 26 using an apparatus such as that shown in FIG. 7. In this operation, partially finished structure 28 and other such structures (sometimes simply referred to as substrates) are loaded edgewise onto a substrate holder 32 which is inserted into a quartz tube reaction chamber 34. Its sealing door 36 is then closed to seal off chamber 34. A resistance-heated furnace chamber 38 provides heat to chamber 34. Furnace chamber 38 encloses the portion of reaction chamber 34 where structures 28 are placed and is regulated with a temperature controller 40. The temperature in chamber 34 is determined by a chromel-alumel thermocouple 42 located in close proximity to holder 32 and connected to an external temperature display 44.

Tungsten hexafluoride is provided to chamber 34 from a WF$_6$ liquid source bottle 46 by way of a WF$_6$ supply line through an automatic flow controller 48 to an inlet port on sealing door 36. A heating jacket 50 on source bottle 46 heats the tungsten hexafluoride slightly above its vaporization temperature. Hydrogen is provided to chamber 34 from an H$_2$ gas source bottle 52 by way of an H$_2$ supply line through a palladium diffusion hydrogen purifier 54 and another automatic flow controller 56 to another inlet port on door 36. Suitable valves along the WF$_6$ and H$_2$ supply lines control the transmission of WF$_6$ and H$_2$ from bottles 46 and 52 to chamber 34.

The pressure in chamber 34 is reduced to a low level by a series combination of a Roots blower vacuum pump 58 and a mechanical rotary-vane vacuum pump 60. Blower pump 58 is connected by way of one part of an evacuation line to the end of chamber 34 opposite door 36, while mechanical pump 60 exhausts through another part of the evacuation line to the atmosphere. Suitable valves along the evacuation line further control the transmission of gases to and from chamber 34.

In performing the selective tungsten deposition, chamber 34 is first evacuated to a pressure of less than 0.05 torr. Structures 28 are then heated to a temperature in the range of 270° C. to 400° C. and preferably in the range of 270° C. to 350° C. The structure (or deposition) temperature is optimally 300° C. During the period in which structures 28 rise to the desired temperature, chamber 34 is purged with H$_2$ supplied from source bottle 52. The purge could also be done with an inert gas such as argon or nitrogen provided from an external source. During purging, the pressure in chamber 34 rises to about 0.1 to 1 torr and is typically about 0.3 torr. The purge is stopped when structures 28 reach the desired temperature in the foregoing range. Chamber 34 is re-evacuated to a pressure of less than 0.05 torr.

Metered quantities of WF$_6$ and H$_2$ regulated by controllers 48 and 56 are now introduced into chamber 34 until W layer 30 reaches the desired thickness. The WF$_6$ flow rate should be no more than 8,000 standard cm$^3$/minute and is preferably 1,500 standard cm$^3$/minute. The H$_2$ flow rate should be no more than 1,000 standard cm$^3$/minute and is preferably 200 standard cm$^3$/minute. To achieve the foregoing thickness of about 1,500 angstroms for layer 30, the WF$_6$ and H$_2$ flows to chamber 34 continue for about 30 minutes. During this period, the hydrogen reduces the tungsten hexafluoride on surface portion 26 so as to free the tungsten and allow it to adsorb there and create layer 30.

The W deposition pressure is 5 torr or less. Above this level, the flow in chamber 34 would be viscous, causing the concentrations of the reactant species to vary throughout chamber 34 so as to make the W deposition on structures 28 non-uniform. That is, the thickness of W layer 30 would vary from structure 28 to structure 28 and from point to point on any structure 28. In addition, there would be marked ablation of insulating layers 12 and 20. The deposition pressure in chamber 34 is preferably 1 torr or less at which consistent molecular flow occurs. This causes W layer 30 to be of relatively uniform thickness throughout chamber 34. The deposition pressure is typically 0.5 torr. The minimum deposition pressure is 0.05 to 0.3 torr depending on the gas flow rates and the pumping capability of the evacuation system.

The W deposition proceeds according to the reaction

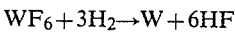

$$WF_6 + 3H_2 \rightarrow W + 6HF$$

This reaction is surface controlled under the preceding deposition conditions. With reference to FIGS. 3a–3c, the rate-limiting mechanism is the dissociation of hydrogen at surface portion 26 and at the exposed areas of insulating layers 12 and 20 so as to enable monatomic hydrogen to react with WF$_6$. With structure 28 pretreated as described above, the structure temperature of 400° C. is roughly the dividing line at which conductive layer 16 supports substantial H$_2$ dissociation at surface portion 26 while layers 12 and 20 do not support significant H$_2$ dissociation at their exposed areas. Above this value, the control over selectivity between layer 16 and layers 12 and 20 rapidly diminishes. At 350° C. or less, there is sufficient difference between the capability of layer 16 to cause substantial H$_2$ dissociation at surface portion 26 and the inability of layers 12 and 20 to cause significant H$_2$ dissociation at their exposed areas that the thickness of W layer 30 can be readily controlled whereas only an electrically unconsequential amount of tungsten simultaneously accrues on layers 12 and 20. 270° C. is the minimum structure temperature at which W deposition begins to occur essentially instantaneously on surface portion 26.

The capability of a surface to sustain H$_2$ dissociation increases with surface non-cleanliness—i.e., organic residues, dust, and particulates. The selectivity difference between surface portion 26 and the exposed areas of insulating layers 12 and 20 diminishes rapidly as these surfaces all become progressively dirtier. The preclean operation performed before structure 28 is placed in chamber 34 in combination with the subsequent purge thus inhibits W deposition on the exposed areas of layers 12 and 20 so as to enhance the selectivity mechanism.

Because of the low deposition pressure and the low surface concentration of the hydrogen fluoride produced in the reduction reaction, no significant ablation of either insulating layer 12 or 20 occurs during the W deposition. Typically, less than 20 angstroms in thickness of a portion of layer 12 or 20 very close to W layer 30 is eroded away. For a portion of layer 12 or 20 not close to layer 30, less than 5 angstroms in thickness is typically eroded away.

After removing structure 28 from chamber 34, a cleaning step is typically performed to remove any tungsten that may have accumulated on insulating layers 12 and 20. This cleaning does not substantially affect the thickness of W layer 30. The cleaning is preferably done at 18° C.–22° C. for 5 minutes with $H_2O_2$, resulting in an etch rate of about 40 angstroms/minute.

As shown in FIGS. 4a and 4b, an electrically conductive layer 62 of aluminum with up to 4% Cu by weight and/or up to 4% Si by weight is sputter deposited to a thickness of about 15,000 angstroms on the exposed upper surface of the resulting structure—i.e., on W layer 30 and on the exposed areas of insulating layers 12 and 20. Conductive layer 62 is optimally Al with about 1% Cu.

Conductive layer 62 is now patterned in such a manner that a part of the resulting second patterned conductive layer 64 is in contact with a part of W layer 30 as indicated in FIGS. 5a–5c. This patterning is performed by creating an appropriate photoresist mask (not shown) on conductive layer 62 and then removing the undesired portions of layer 62 with a suitable etchant that does not significantly attack tungsten or the material of insulating layers 12 and 20. The etching is preferably done at 100° C. for 12 minutes at a pressure of about 0.01 torr with a plasma consisting of equal parts by input volume of $BCl_3$ and $Cl_2$ at 1,000 watts of RF power. Resulting patterned layer 64 is a conductive line having a width of about 4 microns oriented perpendicular to conductive line 16. Since aperture 24 is wider than conductive line 64, this patterning exposes portions 66 of layer 30. Inasmuch as the etchant used in this patterning does not attack tungsten to any significant degree, portions 66 act as an etch stop to avoid damage to the underlying portion of conductive layer 16. In short, layer 30 (in combination with insulating layers 12 and 20) prevents undesired open circuiting of line 16.

The electrical interconnection structure may now be finished in a conventional manner. Typically a $Si_3N_4$ layer (not shown) is deposited on the top of the structure. Openings are then created in this layer for an external lead pattern after which the structure is suitably packaged.

Before finishing the structure in this manner, W portions 66 may optionally be removed by etching with an etchant that does not significantly attack insulating layers 12 and 20 or conductive layers 16 and 64. This etching is preferably performed with $H_2O_2$ for 40 minutes at 18° C.–22° C. In this etching, conductive layer 64 serves as a mask to prevent any significant etching of underlying tungsten portion 68. The structure may now be finished in the conventional manner described above.

Other dielectrics which (when suitably clean) do not support significant $H_2$ dissociation at a structure temperature of 400° C. or less and preferably 350° C. or less could be used in place of $SiO_2$ in layer 12 or $Si_3N_4$ in layer 20.

Likewise, certain other conductors which are capable of supporting substantial $H_2$ dissociation when the structure temperature is 270° C. or more could be employed in place of the aluminum/aluminum alloy in conductive layer 16. Suitable alternative conductors include tungsten itself, titanium, titanium-tungsten, molybdenum, chromium, gold, and various metal silicides including platinum silicide, nickel silicide, nickel-platinum silicide, and palladium silicide. If tungsten itself is employed in layer 16, the step involving removal of W portions 66 would not be performed. Depending on the alternative material chosen, chemical reactions different from those described above might have to be employed in some of the steps. The foregoing materials could also be used in conductive layer 64.

Conductive layer 16 may also consist of doped polycrystalline silicon. In this case, layer 16 could be created by depositing a layer of polycrystalline silicon doped with a suitable N-type or P-type impurity and then suitably patterning the deposited layer. Alternatively, layer 16 could be created by depositing a layer of substantially intrinsic (i.e., undoped) polycrystalline silicon and then doping this layer with a suitable impurity before or after patterning. Layer 64 could also consist of doped polycrystalline silicon formed in one of the foregoing ways.

If layer 16 is formed from doped polycrystalline silicon, there is a slight change in the W deposition procedure from that described above. After structure 28 is inserted in reaction chamber 34 and the $WF_6$ flow is initiated, the tungsten hexafluoride reacts with silicon along exposed surface portion 26 according to the reaction.

$$2WF_6 + 3Si \rightarrow 2W + 3SiF_4$$

The silicon tetrafluoride is gaseous and leaves the immediate vicinity of surface portion 26. Accordingly, a thin tungsten layer replaces a thin silicon layer along surface portion 26. This reaction stops when the thin W layer is sufficiently thick, typically 100–400 angstroms, to prevent $WF_6$ from reaching silicon in layer 16. During this time period, it is not necessary to provide $H_2$ to structure 28. However, $H_2$ may be provided during this period since the hydrogen will not have any detrimental effect. After the foregoing reaction has stopped, further W deposition to bring layer 30 to the desired thickness occurs in the manner described above by hydrogen reduction of $WF_6$.

While the invention has been described with reference to particular embodiments, this description is solely for the purpose of illustration and is not to be construed as limiting the scope of the invention claimed below. For example, a tungsten-containing species other than $WF_6$ might be employed in providing the tungsten. Thus, various modifications, changes, and applications may be made by those skilled in the art without departing from the true scope and spirit of the invention as defined by the appended claims.

What is claimed is:

1. A method of forming a structure for an electrical interconnection of an electrical device in which a first patterned electrically conductive layer is defined over a first electrically insulating layer, a second electrically insulating layer is formed over the first conductive layer and over adjacent material of the first insulating layer not underlying the first conductive layer, and an aperture is created through the second insulating layer to expose a surface portion of the first conductive layer, characterized by the steps of:

depositing tungsten on substantially all of the surface portion to form an intermediate electrically conductive layer whose thickness is proportionally much greater than the thickness of any tungsten then accruing on nearby material of the second insulating layer;

depositing a further electrically conductive layer on the intermediate conductive layer and over the remainder of the second insulating layer; and patterning the further conductive layer with etchant that does not significantly attack tungsten or the material of the second insulating layer to define a second patterned electrically conductive layer having a part in contact with at least a part of the intermediate conductive layer.

2. A method as in claim 1 characterized in the step of depositing tungsten is performed by chemical vapor deposition at a pressure no greater than 5 torr.

3. A method as in claim 2 characterized in that the chemical vapor deposition is performed at a temperature in the range of 270° C. to 400° C.

4. A method as in claim 3 characterized in that tungsten is provided from a tungsten-containing species by hydrogen reduction in the immediate vicinity of the surface portion.

5. A method as in claim 4 characterized in that the chemical species is tungsten hexafluoride.

6. A method as in claim 4 characterized in that no significant ablation of the second insulating layer occurs during the chemical vapor deposition.

7. A method as in claim 6 characterized in that the temperature of the chemical vapor deposition is not greater than 350° C.

8. A method as in claim 1 characterized in that:
the first conductive layer supports substantial hydrogen dissociation when the temperature of the structure is in the range of 270° C. to 400° C.; and
the second insulating layer does not support significant hydrogen dissociation energy when the temperature of the structure is in the foregoing range.

9. A method as in claim 8 characterized in that the step of depositing tungsten is performed by chemical vapor deposition in which tungsten is provided from a tungsten-containing species by hydrogen reduction in the immediate vicinity of the surface portion.

10. A method as in claim 9 characterized in that the first conductive layer substantially consists of aluminum with no more than 4% by weight of copper and no more than 4% by weight of silicon.

11. A method as in claim 9 characterized in that the first conductive layer principally consists of a material in the following group: tungsten, titanium, titanium-tungsten, molybdenum, chromium, gold, and a metal silicide wherein the metal is platinum, nickel, nickel-platinum, or palladium.

12. A method as in claim 1 characterized in that the step of depositing tungsten is performed by chemical vapor deposition of tungsten from a tungsten-containing species wherein a very thin silicon layer at the surface portion is first replaced with a very thin layer of tungsten provided from the tungsten-containing species after which tungsten is deposited on the thin layer of tungsten by hydrogen reduction of the tungsten-containing species.

13. A method as in claim 12 characterized in that the first conductive layer substantially consists of doped polycrystalline silicon.

14. A method as in claim 1 wherein the aperture is also created down to, but no more than partly into, the first insulating layer, characterized in that:
the thickness of the intermediate conductive layer formed during the step of depositing tungsten is proportionally much greater than the thickness of any tungsten then accruing on material of the first insulating layer adjacent to the surface portion; and
the second conductive layer is also deposited over material of the first insulating layer exposed by the aperture.

15. A method as in claim 14 characterized in that the etchant used during the step of patterning the further conductive layer does not significantly attack material of the first insulating layer, whereby substantially no simultaneous etching of the first conductive layer occurs.

16. A method as in claim 15 characterized in that no significant ablation of either insulating layer occurs during the step of depositing tungsten.

17. A method as in claim 14 characterized by the step of removing any tungsten that accrued on either insulating layer during the step of depositing tungsten.

18. A method as in claim 14 characterized in that:
the first conductive layer supports substantial hydrogen dissociation when the temperature of the structure is in the range of 270° C. to 400° C.; and
neither insulating layer supports significant hydrogen dissociation when the temperature of the structure is in the foregoing range.

19. A method as in claim 1 characterized by the step of removing any portion of the intermediate conductive layer extending laterally beyond the second conductive layer.

20. A method as in claim 19 characterized in that the step of removing involves using the second conductive layer as a mask to protect material of the intermediate conductive layer under the second conductive layer.

21. A method as in claim 1 characterized in that the step of depositing tungsten is performed by chemical vapor deposition.

22. A method as in claim 21 characterized in that the tungsten is provided by hydrogen reduction of a tungsten-containing species in the immediate vicinity of the surface portion.

23. A method as in claim 1 characterized in that the first conductive layer comprises at least one material in the following group: tungsten, titanium, titanium-tungsten, molybdenum, chromium, gold, doped polycrystalline silicon, and a metal silicide.

24. A method as in claim 23 characterized in that the step of depositing tungsten is performed by chameical vapor deposition in which tungsten is provided by hydrogen reduction of a tungsten-containing species at a pressure no greater than 5 torr.

* * * * *